US006090717A

United States Patent [19]
Powell et al.

[11] Patent Number: 6,090,717
[45] Date of Patent: *Jul. 18, 2000

[54] HIGH DENSITY PLASMA ETCHING OF METALLIZATION LAYER USING CHLORINE AND NITROGEN

[75] Inventors: Stephen F. Powell, Woodside, Calif.; Jeffrey V. Musser, Boise, Id.; Robert Guerra, Fremont; Timothy R. Webb, San Francisco, both of Calif.

[73] Assignee: Lam Research Corporation, Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/622,657

[22] Filed: Mar. 26, 1996

[51] Int. Cl.[7] .................................................. H01L 21/302
[52] U.S. Cl. ............................ 438/710; 438/720; 216/64; 216/67; 216/71; 216/74; 216/75; 216/77
[58] Field of Search ..................................... 438/710, 720, 438/711; 216/67, 64, 74, 75, 77, 71

[56] References Cited

U.S. PATENT DOCUMENTS

| 3,994,793 | 11/1976 | Harvilchuck et al. | 204/192.25 |
|---|---|---|---|
| 4,350,563 | 9/1982 | Takada et al. | 438/694 |
| 4,370,196 | 1/1983 | Vossen, Jr. et al. | 438/720 |
| 4,373,990 | 2/1983 | Porter | 438/720 |
| 4,678,540 | 7/1987 | Uchimura | 438/713 |
| 5,126,008 | 6/1992 | Levy | 438/720 |
| 5,185,058 | 2/1993 | Cathey, Jr. | 438/695 |
| 5,207,868 | 5/1993 | Shinohara | 438/696 |
| 5,211,804 | 5/1993 | Kobayashi | 216/70 |
| 5,350,488 | 9/1994 | Webb | 216/67 |
| 5,387,556 | 2/1995 | Xiaobing et al. | 438/695 |
| 5,604,381 | 2/1997 | Shen | 257/773 |
| 5,779,926 | 7/1998 | Ma et al. | 216/67 |
| 5,783,101 | 7/1998 | Ma et al. | 216/68 |

FOREIGN PATENT DOCUMENTS

| 076 860 A1 | 4/1983 | European Pat. Off. | H01L 21/321 |
|---|---|---|---|
| 427 327 A1 | 5/1991 | European Pat. Off. | H01L 21/321 |
| 622 477A | 2/1994 | European Pat. Off. | C23F 4/00 |
| 702 391A | 2/1996 | European Pat. Off. | H01J 37/32 |
| 59-220928 | 12/1984 | Japan | H01L 21/302 |

OTHER PUBLICATIONS

English Translation of JP–59–220928, Okano, Dec. 12, 1984.
English Translation of JP–6–163538, Toshihide, Jun. 10, 1994.
Toshide, "Patent Abstracts of Japan", vol. 018, No. 477 (E–1602), & JP 06 163538A, Sumitomo Metal Ind Ltd., Jun. 10, 1994 (Publication date).
Hironori "Patent Abstracts of Japan", vol. 018, No. 392 (C–1228), & JP 06 108272A, Sumitomo Metal Ind Ltd., Apr. 19, 1994 (Publication date).
P.E. Riley, S.S. Peng, and L. Fang, "Plasma Etching of Aluminum for ULSI Circuits," Solid State Technology, pp. 47–55, Feb. 1993.
R.A. Gottscho, C.W. Jurgensen, and D.J. Vitkavage, "Microscopic uniformity in plasma etching," J. Vac. Sci. Technol. B 10(5), pp. 2133–2147 (1992).

(List continued on next page.)

Primary Examiner—Mark Chapman
Attorney, Agent, or Firm—Beyer Weaver & Thomas LLP

[57] ABSTRACT

A method in a plasma processing chamber for etching through a selected portion of a metallization layer of a wafer's layer stack. The method includes the step of etching at least partially through the metallization layer of the layer stack with an etchant source gas that consists essentially of chlorine and nitrogen. In another embodiment, the metallization layer comprises aluminum, and the flow ratio of the chlorine to the nitrogen ranges from about 1:1 to about 10:1. More preferably, the flow ratio of the chlorine to the nitrogen ranges from about 1:1 to about 4:1 and preferably ranges from about 1:1 to about 2:1.

10 Claims, 6 Drawing Sheets

OTHER PUBLICATIONS

H.C. Jones, R. Bennett, and J. Singh, "*Size Dependant Etching of Small Shapes,*" Proc. 8$^{th}$ Plasma Symp., ECS vol. 90–2, pp. 45–58 (1990).

N. Kofuji, K. Tsujimoto, T. Kumihashi, and S. Tachi, "*Reduction in Microloading by High–Gas–Flow–Rate Electron Cyclotron Resonance Plasma Etching,*" Jpn. J. Appl. Phys. 34 (Pt. 1 No. 5A), pp. 2489–2494 (1995).

T. Sato, N. Fujiwara, and M. Yoneda, "*Mechanism of Reactive Ion Etching Lag for Aluminum Alloy Etching,*" Jpn. J. Appl. Phys. 34(Pt. 1 No. 4B), pp. 2142–2146 (1995).

Y. Kusumi, N. Fujiwara, J. Matsumoto, and M. Yoneda, "*Effect of $N_2$ Addition on Aluminum Alloy Etching by Electron Cyclotron Resonance Reactive Ion Etching and Magnetically Enhanced Reactive Ion Etching,*" Jpn. J.Appl. Phys. 34 (Pt. No. 4B), 2147–2151 (1995).

N. Fujiwara, H. Sawai, M. Yoneda, K. Nishioka, and H. Abe, "*ECR Plasma Etching with Heavy Halogen Ions,*" Jpn. J. Appl. Phys. 29 (No. 10), 2223–2228 (1995).

HIGH DENSITY PLASMA ETCHING OF METALLIZATION LAYER USING CHLORINE AND NITROGEN

BACKGROUND OF THE INVENTION

The present invention relates to the fabrication of semiconductor integrated circuits (IC's). More particularly, the present invention relates to methods and apparatus for etching through an IC's layer stack, including the metallization layer, during IC fabrication.

In semiconductor IC fabrication, devices such as component transistors are formed on a semiconductor wafer or substrate, which is typically made of silicon. Metallic interconnect lines, which are etched from a metallization layer disposed above the wafer, are then employed to couple the devices together to form the desired circuit. To facilitate discussion, FIG. 1 illustrates a cross-sectional view of a layer stack 20, representing the layers formed during the fabrication of a typical semiconductor IC. It should be noted that other additional layers above, below, or between the layers shown may be present. Further, not all of the shown layers need necessarily be present and some or all may be substituted by other different layers.

At the bottom of layer stack 20, there is shown a wafer 100. An oxide layer 102, typically comprising $SiO_2$, is formed above wafer 100. A barrier layer 104, typically formed of Ti, TiW, TiN or other suitable barrier materials, may be disposed between oxide layer 102 and a subsequently deposited metallization layer 106. Barrier layer 104, when provided, functions to prevent the diffusion of silicon atoms from oxide layer 102 into the metallization layer.

Metallization layer 106 typically comprises copper, aluminum or one of the known aluminum alloys such as Al—Cu, Al—Si, or Al—Cu—Si. For convenience, the metallization layer 106 is referred to herein as the aluminum layer although it should be understood that such a reference may include a layer consisting of any of the aforementioned aluminum alloys. The remaining two layers of FIG. 1, i.e., an anti-reflective coating (ARC) layer 108 and an overlaying photoresist (PR) layer 110, are then formed atop metallization layer 106. The ARC layer 108, typically comprising TiN or TiW, helps prevent light (e.g., from the lithography step that patterns the photoresist) from being reflected and scattered off the surface of the metallization layer 106 and may, in some cases, inhibit hillock growth. Photoresist layer 110 represents a layer of conventional photoresist material, which may be patterned for etching, e.g., through exposure to ultra-violet rays. The layers of layer stack 20 are readily recognizable to those skilled in the art and may be formed using any of a number of suitable and known deposition processes, including chemical vapor deposition (CVD), plasma-enhanced chemical vapor deposition (PECVD), and physical vapor deposition (PVD) such as sputtering.

To form the aforementioned metallic interconnect lines, a portion of the layers of the layer stack, including the metallization layer, e.g., metallization layer 106, are etched using a suitable photoresist technique. By way of example, one such photoresist technique involves the patterning of photoresist layer 110 by exposing the photoresist material in a contact or stepper lithography system, and the development of the photoresist material to form a mask to facilitate subsequent etching. Using an appropriate etchant, the areas of the metallization layer that are unprotected by the mask are then etched away, leaving behind metallization interconnect lines or features.

For illustrative purposes, FIG. 2 shows a cross-sectional view of layer stack 20 of FIG. 1 after conventional etching is completed. In this example, the metallic interconnect lines are represented by the unetched portions of metallization layer 106.

To achieve greater circuit density, modern IC circuits are scaled with increasingly narrower design rules. As a result, the feature sizes, i.e., the width of the interconnect lines or the spacings (e.g., trenches) between adjacent interconnect lines, have steadily decreased. By way of example, while a line width of approximately 0.8 microns ($\mu$m) is considered acceptable in a 4 megabit (Mb) dynamic random access memory (DRAM) IC, 256 Mb DRAM IC's preferably employ interconnect lines as thin as 0.25 microns or even thinner.

As the feature sizes shrink, it becomes increasingly difficult to achieve a uniform etch rate across the wafer. Typically, the etch rate in the narrow spacings is slower than that in wider trenches or open field regions. This phenomenon, referred herein as the loading in etch rates, may be a consequence of microloading and/or aspect ratio dependent etching (ARDE). Microloading refers primarily to the situation wherein the etch rate is smaller in areas where there is a high density of line spacings relative to the etch rate of identically sized trenches located in a less dense area. ARDE, on the other hand, refers primarily to the situation wherein variations in etch rates are observed among trenches that are located in areas of similar trench density and among trenches that have different aspect ratios. The loading in etch rates causes trenches to be formed in the layer stack at different rates. The loading in etch rates becomes more severe when trench widths fall below about 0.8 microns, and especially when trench widths fall below about 0.35 microns. As a result of the etch rate variations, by the time metal etching is complete in areas having a slow etch rate (e.g., in the narrower line spacings), overetching, i.e., the inadvertent removal of materials from underlying layers, may have already occurred in areas having a higher etch rate (e.g., the open field regions).

With reference to FIG. 2, area 120 represents an open field region where the metallization layer is overetched (by distance d1 or d3). Area 122 represents the region where the etch rate loading has the potential to occur. The metallization at the bottom of the trench is underetched by distance $\Delta X_n$ (or $X_0-d_2$). If the etch rate variations are sufficiently large, it may not be possible, for some geometry, to etch though the target layer, e.g., the metal layer, in the narrower spacings before undue damage to the underlying layers in the open field regions occurs. For example, large etch rate variations may cause undue overetching and excessive oxide loss in area 120, rendering the wafer undergoing processing unsuitable for use in IC fabrication.

In view of the foregoing, what is desired is improved methods and apparatus for minimizing the loading in etch rates in the etching of the layer stack.

SUMMARY OF THE INVENTION

The invention relates, in one embodiment, to a method in a plasma processing chamber for etching through a selected portion of a metallization layer of a wafer's layer stack. The method includes the step of etching at least partially through the metallization layer of the layer stack with an etchant source gas that consists essentially of chlorine and nitrogen. In the preferred embodiment, the etching step is performed without employing $BCl_3$. In another embodiment, the metallization layer comprises aluminum, and the flow ratio of the chlorine to the nitrogen ranges from about 1:1 to about 10:1. More preferably, the flow ratio of the chlorine to the nitrogen ranges from about 1:1 to about 4:1 and preferably from about 1:1 to about 2:1.

In yet another embodiment, the invention relates to an integrated circuit having components formed on a semiconductor die, which has thereon etched layers of a layer stack. The integrated circuit includes an aluminum-containing layer. In this embodiment, the aluminum-containing layer is etched in a plasma processing chamber with an etchant source gas that consists essentially of chlorine and nitrogen.

These and other advantages of the present invention will become apparent upon reading the following detailed descriptions and studying the various drawings.

DETAILED DESCRIPTION OF THE PREFERRED EMBODIMENTS

Figure 1:
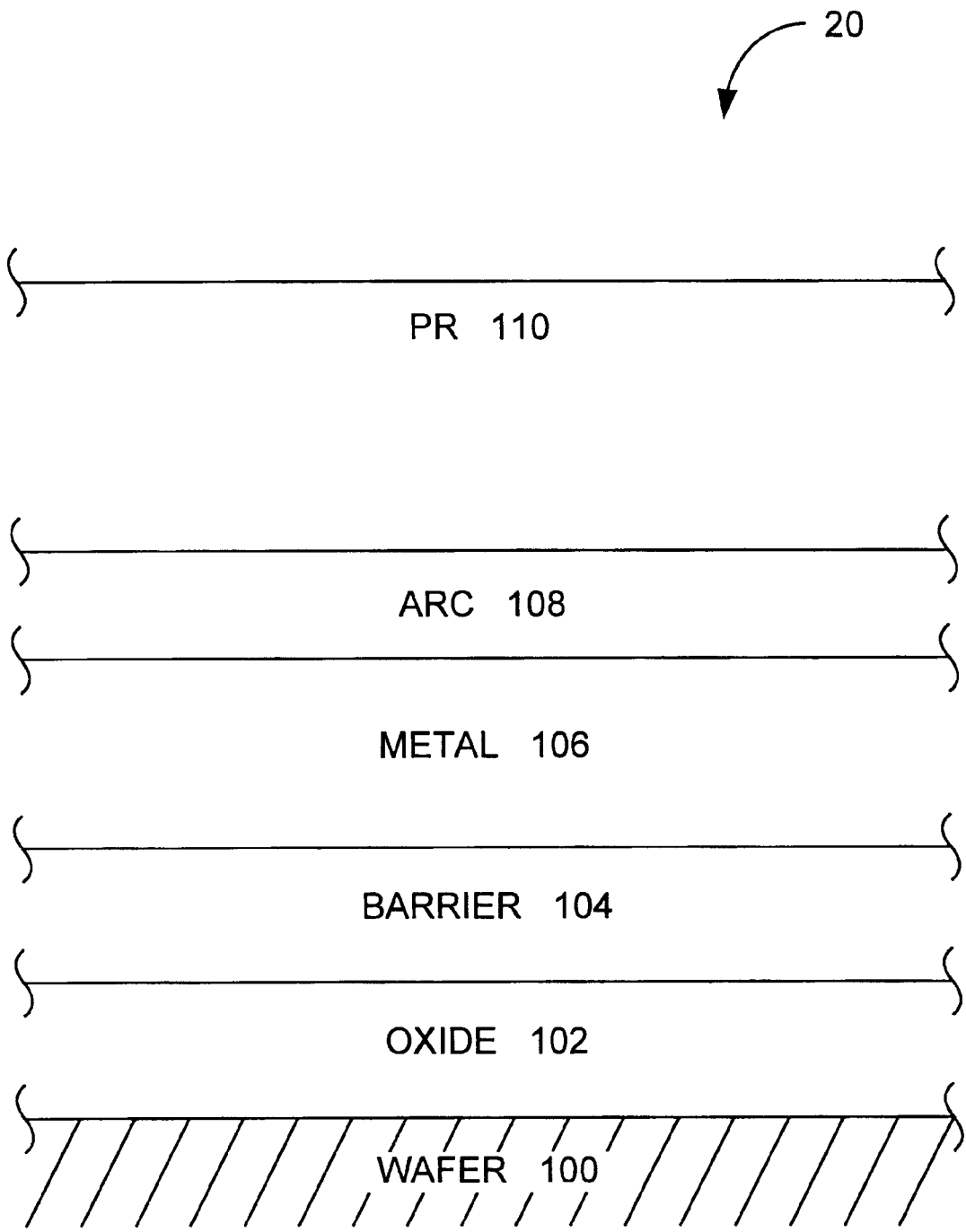
FIG. 1 illustrates a cross-sectional view of a layer stack, representing the layers formed during the fabrication of a typical semiconductor IC.

An invention is described for minimizing, in a plasma processing chamber, the etch rate loading problem while achieving commercially advantageous etch rates and selectivities using a 2-component etchant source gas (or feed gas) consisting essentially of nitrogen ($N_2$) and chlorine ($Cl_2$). In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In accordance with one aspect of the present invention, the aforementioned etch rate loading problem is alleviated by etching the metallization layer with an etchant source gas that consists essentially of two components, chlorine and nitrogen. The inventive two-component $Cl_2/N_2$ etch technique may be performed in any of the known plasma processing apparatuses, including those adapted for dry etching, plasma etching, reactive ion etching (RIE), magnetically enhanced reactive ion etching (MERIE), electron cyclotron resonance (ECR), or the like. To further elaborate, in a typical plasma processing chamber adapted for dry etching, the wafer is treated with plasma. The chamber includes an inlet port through which process etchant source gases are supplied to the chamber interior. A suitable RF energy source is applied to electrodes associated with the chamber to induce a plasma from the etchant source gases. The energy itself may be coupled inductively or capacitively to sustain the plasma, as is known. Species are then formed from the etchant source gas to react with the layer stack and etch away at the plasma-contacting regions of the wafer layer stack. The by-products, which may be volatile, are then exhausted through an exit port.

Plasma etching relates to the situation where the wafer is positioned on the anode, or ground electrode during wafer processing. On the other hand, reactive ion etching (RIE) relates to the situation where the wafer is positioned on the cathode, or powered electrode during processing. Magnetically enhanced reactive ion etching (MERIE) represents a variant of the RIE reactor geometry wherein a magnetic field is applied to reduce the loss of energetic electrons to the reactor wall surfaces. It has been found that the MERIE reactors, under certain conditions, can increase the efficiency of the energy transfer from the electrodes to the electrons in the plasma.

It is contemplated that the invention may be practiced in any of the above reactors, as well as other suitable plasma processing reactors. Note that the above is true irrespective of whether energy to the plasma is delivered through capacitively coupled parallel electrode plates, through ECR microwave plasma sources, or through inductively coupled RF sources such as helicon, helical resonators, and transformer coupled plasma. ECR and TCP™ (transformer coupled plasma) processing systems, among others, are readily available commercially. TCP™ systems are available from, for example, Lam Research Corporation of Fremont, Calif.

Figure 3:
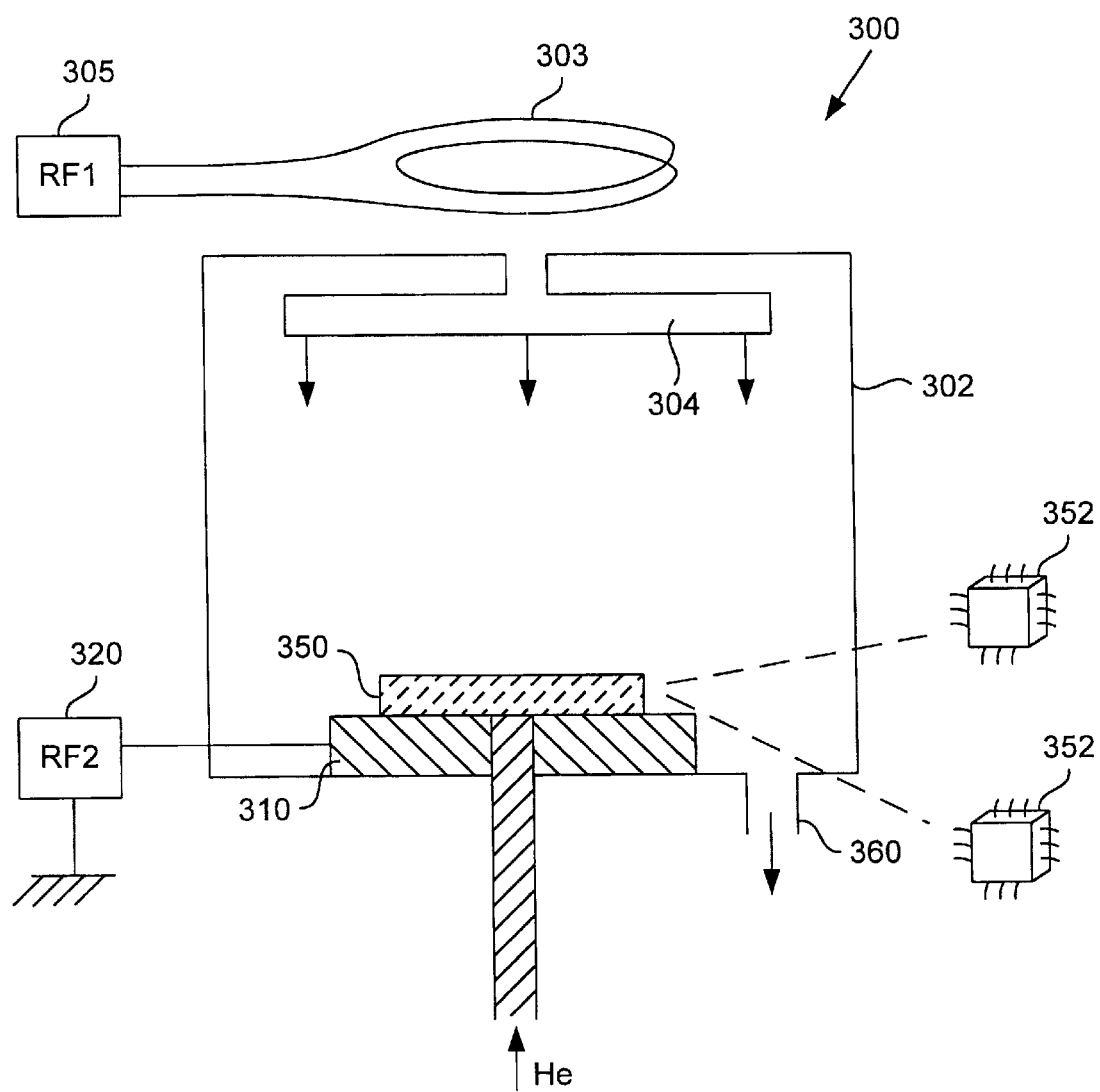
FIG. 3 is a simplified schematic diagram of a plasma reactor that may be suitably employed with the inventive two-chemistry etch technique.

In a preferred embodiment, the present invention is employed in a TCP™ 9600 SE plasma reactor, which is available from Lam Research Corporation, although, as mentioned above, any conventional and suitable plasma processing systems may well be employed. FIG. 3 illustrates a simplified schematic of the TCP™ 9600 SE plasma reactor, including wafer 350 and integrated circuit chips 352, which are fabricated from dies cut from wafer 350 after the wafer is etched according to the inventive etch and processed in conventional post-etch steps. Referring to FIG. 3, a wafer reactor 300 includes a plasma processing chamber 302. Above chamber 302, there is disposed an electrode 303, which is implemented by a coil in the example of FIG. 3. Coil 303 is energized by a RF generator 305 via a matching network (not shown in FIG. 3).

Within chamber 302, there is provided a shower head 304, which preferably includes a plurality of holes for releasing gaseous source materials, e.g., the etchant source gases, into the RF-induced plasma region between shower head 304 and a wafer 350. The gaseous source materials may also be released from ports built into the walls of the chamber itself. Wafer 350 is introduced into chamber 302 and disposed on a chuck 310, which acts as a second electrode and is preferably biased by a radio frequency generator 320 (also typically via a matching network). Helium cooling gas is introduced under pressure (e.g., about 5–10 Torr in one embodiment) between chuck 310 and wafer 350 to act as a heat transfer medium for accurately controlling the wafer's temperature during processing to ensure uniform and repeatable etching results. During plasma etching, the pressure within chamber 302 is preferably kept low by withdrawing gas through port 360, e.g., between about 5 to 25 mTorr in one embodiment. A plurality of heaters (omitted from FIG. 3 to simplify the illustration) may be provided to maintain a suitable chamber temperature for etching (e.g., about 70° C. in one embodiment). To provide an electrical path to ground, the chamber wall of chamber 302 is typically grounded.

As mentioned, the invention employs an etchant source gas comprising essentially of two components: chlorine and nitrogen. In accordance with one aspect of the present invention, the use of $N_2$ as one component of the two primary components that make up the inventive etchant source gas advantageously permits the aluminum sidewall and other surfaces of the wafer to be passivated during etching. In accordance with another aspect of the invention, the inventive etch technique preferably does not employ $BCl_3$, a common component in prior art etchant source gases, to etch through the aluminum layer and/or the native aluminum oxide layer.

The use of only two-etchant source components advantageously simplifies the adjustment of the volumetric flows of the gas components during plasma processing. As such, the present invention represents a significant improvement over prior art techniques wherein, for example, three components (e.g., $BCl_3/Cl_2/N_2$) are required. In such a prior art technique, a delicate balance between the volumetric flow ratios of the three components, e.g., between the volumetric flow ratios of elements A:B and A:C, must be established and represents additional complexities in the control algorithm.

In an unexpected manner, it is found that the inventive $Cl_2/N_2$ two-component etchant source gas not only simplifies the control algorithm by reducing the number of components in the etchant source gas but also alleviates incidents of microloading, aspect ratio dependent etching (ARDE) and reactive ion etching lag (RIE lag as referred to by some researchers), when etching aluminum or any of its alloys. Most importantly, the reduction in microloading and/or ARDE/RIE lag can be achieved through the use of the inventive $Cl_2/N_2$ two-component etchant feed gas without increasing the feed gas flow rates or altering the amount of power applied.

Figure 2:
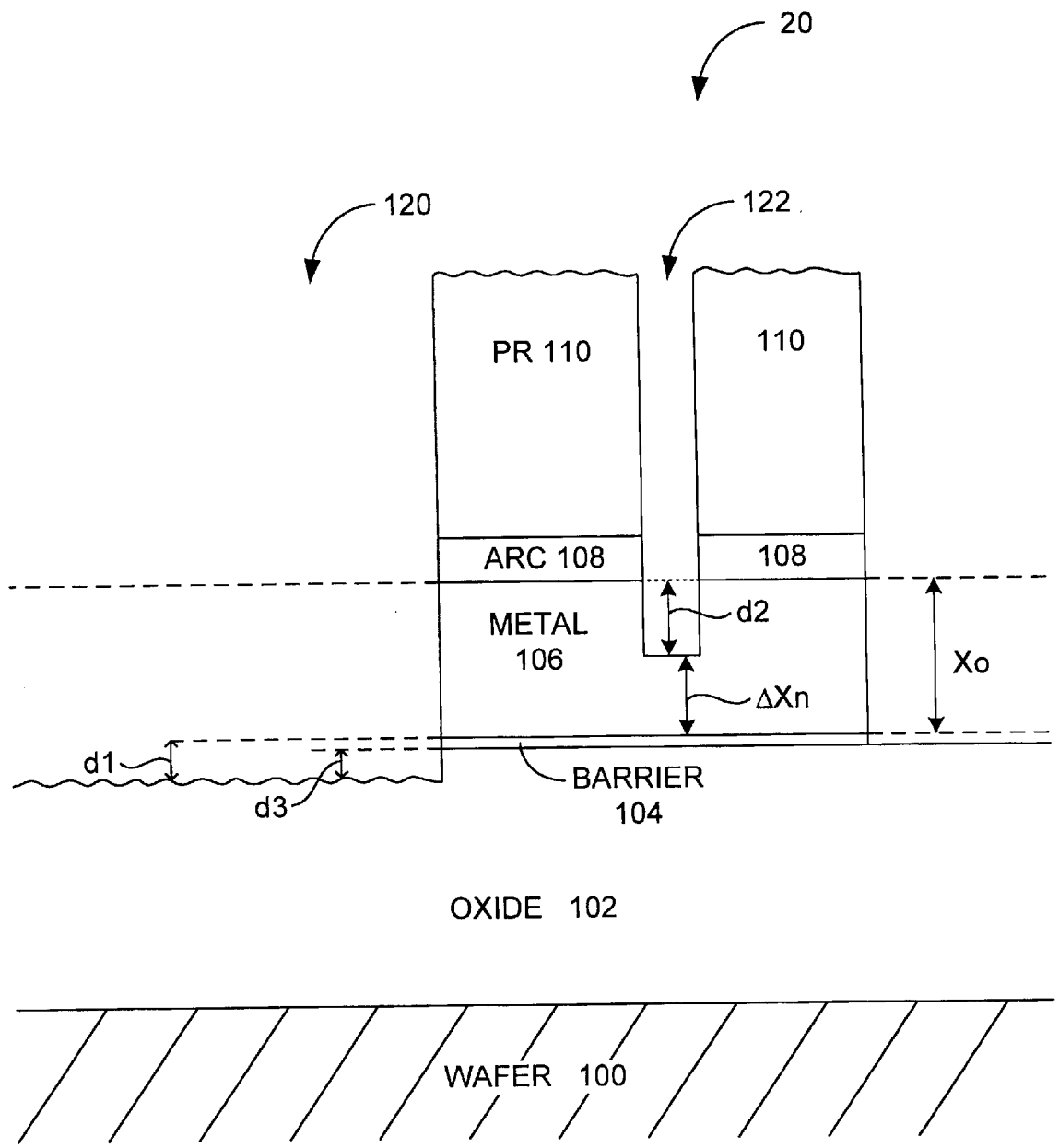
FIG. 2 illustrates a cross-sectional view of the layer stack of FIG. 1 after conventional etching is completed.

To quantitatively illustrate the improvement in ARDE/RIE lag and microloading, the following mathematical definitions are employed. With reference to FIG. 2, aspect ratio dependent etching (ARDE) is defined as $\Delta X_n/X_o$ where $X_o$ represents the etch depth in the open field, i.e., the thickness of the aluminum layer that is etched through in the wide trenches or open field. On the other hand, $\Delta X_n$ represents the etch depth in a particular narrow spacing (with n being the index that refers to a particular line spacing). The difference between the etch depths of a given narrow trench n and that of the open field region, i.e., $X_o-X_n$, is defined as $\Delta X_n$ (with n again representing an index that refers to a particular line spacing). ARDE is thus the thickness of the metal layer, e.g., the aluminum or aluminum alloy layer, that fails to clear in a particular narrow trench normalized by the thickness of the aluminum that does clear in the unobstructed, open field region.

Figure 4A:
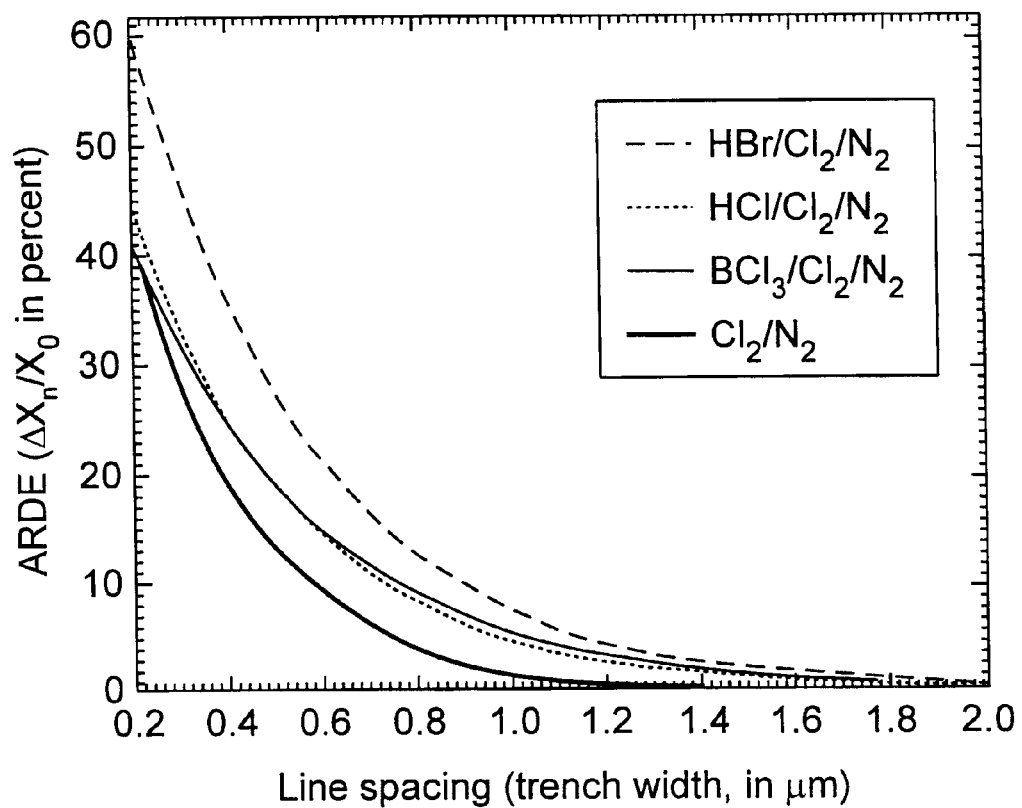
FIG. 4A is a plot illustrating the aspect ratio dependence of an aluminum etch for the inventive $Cl_2/N_2$ two-component etchant source gas versus $HCl/Cl/N_2$, and $BCl_3/Cl_2/N_2$ etchant source gases of the prior art, as well as of an $HBr/Cl_2/N_2$ etchant source gas.

FIG. 4A is a plot illustrating the aspect ratio dependence of an aluminum etch for the inventive $Cl_2/N_2$ two-component etchant source gas versus $HCl/Cl_2/N_2$, and $BCl_3/Cl_2/N_2$ etchant source gases of the prior art, as well as of the $HBr/Cl_2/N_2$ etchant source gas. The data for these four gases are plotted as a function of $\Delta X_n/X_o$ versus line spacing dimensions. An exponentially decaying curve has been fit to the data for each of the etchant source gases, with the individual data points omitted for simplicity. As seen in FIG. 4A, the $Cl_2/N_2$ curve proceeds to smaller trench widths than any of the other three curves before any aspect ratio dependence is observable. In other words, ARDE is significantly less in the smaller geometry spaces when the inventive $Cl_2/N_2$ two-component etchant source gas is employed.

As seen in FIG. 4A, the inventive $C_2/N_2$ two-component etchant source gas exhibits an overall aspect ratio etch rate dependence for aluminum that is significantly lower than that of any of the prior art $BCl_3/Cl_2/N_2$ or $HCl/Cl_2/N_2$ etchant source gas compositions, as well as of an $HBr/Cl_2/N_2$ etchant source gas. This improvement can clearly be seen in the range of line spacings between about 0.2 and 0.8 microns ($\mu m$) and most clearly seen between about 0.4 and 0.8 $\mu m$, where the aspect ratio etch rate dependence for aluminum is about 5 to 10 percent lower for the inventive $Cl_2/N_2$ two-component etchant source gas than for the above two prior art etchant source gas compositions. Over the same range of line spacings, i.e., between about 0.4 and 0.8 microns ($\mu m$), the inventive $Cl_2/N_2$ two-component etchant source gas is about 10 to 15 percent lower than for the $HBr/Cl_2/N_2$ etchant source gas composition. Even below a line spacing of about 0.4 microns, the aspect ratio etch rate dependence for the inventive $Cl_1/N_2$ two-component etchant source gas is still lower than that of the other three etchant source gases.

Figure 4B:
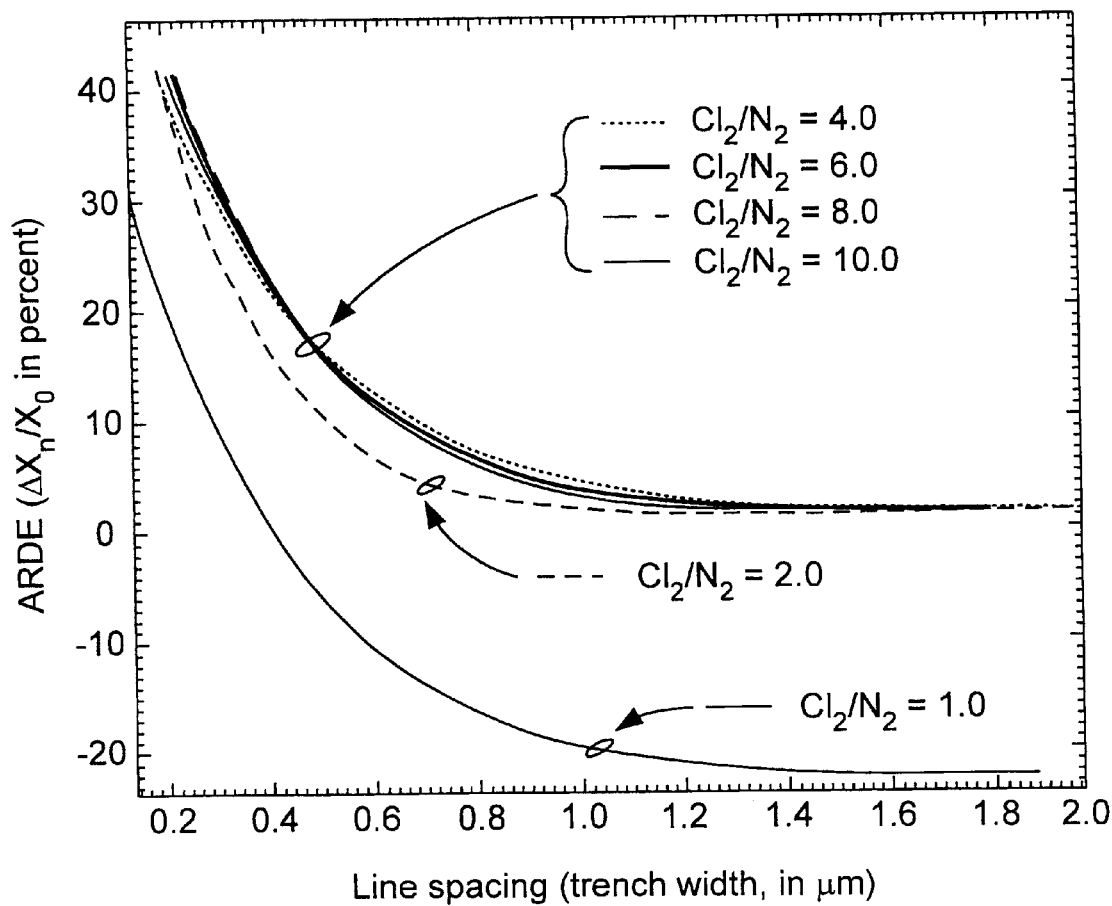
FIG. 4B illustrates the ARDE versus line spacing for various chlorine/nitrogen flow ratios.

FIG. 4B illustrates the ARDE versus line spacing for various chlorine/nitrogen flow ratios. At a chlorine/nitrogen flow ratio of about 1:1, the ARDE extends into the negative region for line spacings above about 0.4 microns, suggesting that the etch may occur at a faster rate in the narrow spacings than in open field regions. At line spacings narrower than about 0.4 microns, the ARDE for this flow ratio is markedly less than those associated with chlorine/nitrogen flow ratios of about 2:1, 4:1, 6:1, 8:1, and 10:1.

FIG. 4B also shows that the ARDE does not extend into the negative region when the chlorine/nitrogen flow ratio is above about 2:1. FIG. 4B suggests that a chlorine/nitrogen flow ratio of between about 1:1–4:1 clearly minimizes the ARDE in small geometry spaces, with a chlorine/nitrogen flow ratio between about 1:1 to about 2:1 offering marked ARDE improvement. Interestingly, the ARDE curves for chlorine/nitrogen flow ratios of about 4:1, 6:1, 8:1, and 10:1 in this experiment overlap somewhat, suggesting that the ARDE is not significantly impacted by increasing the ratio of chlorine to nitrogen flows above about 4:1, e.g., between 4:1 and 10:1.

The aluminum etch rate and aluminum to photoresist selectivity achieved using the inventive chlorine/nitrogen feed gas composition (i.e., one that comprises predominantly of $Cl_2$ and $N_2$) are found to be well within commercially feasible ranges. These commercially feasible ranges are, for example, above about 5,000 angstroms/minute for the aluminum etch rate and between about 2.3 to 1 to about 4.0 to 1 for the aluminum to photoresist selectivity. It should be kept in mind that the specific process results achieved with the inventive $Cl_2/N_2$ two-component etchant source gas are dependent on the deposition conditions of the aluminum layer, the specific aluminum alloy, the type and geometry of the reactor, and the etching process parameters.

In general, the aluminum etch rates depend on the particular volumetric flow ratio of the two gases as well as the total gas flow. By way of example, in a high plasma density reactor configuration such as the aforementioned TCP™ 9600 SE, the aluminum etch rate for a 200 mm wafer with chlorine to nitrogen flow ratios of about 1:1, 2:1, 4:1, 6:1, 8:1, and 10:1 are shown in Table 1 below.

TABLE 1

| Approximate Chlorine/Nitrogen Flow Ratio | Approximate Aluminum etch rate (angstroms/min) |
|---|---|
| 1:1 | 5,700 |
| 2:1 | 10,900 |
| 4:1 | 15,000 |
| 6:1 | 17,100 |
| 8:1 | 18,000 |
| 10:1 | 18,000 |

Selectivity, as is known, is the ratio of the etching rate of a particular layer to any other layer of material that is simultaneously exposed to the plasma. In the etching of a typical layer stack, e.g., layer stack 20 of FIG. 1, the two layers that may be simultaneously exposed during the aluminum etch step are the aluminum layer and the protective, overlaying photoresist masking layer. While the highest etch rate selectivity may not be necessary or even desirable in every case, i.e., due to the beneficial coating effects of photoresist fragments on the aluminum sidewalls, a relatively high selectivity between aluminum and its photoresist masking layer is usually desired to produce the required pattern resolution. In one particular embodiment of the invention, the aluminum to photoresist etch rate selectivity achieved in a TCP™ 9600 SE reactor for a chlorine to nitrogen volumetric flow ratio of about 2:1 and a total flow of about 110 sccm is about 2.7 to 1. The selectivity value found in this sample is well within typical aluminum to photoresist etch rate selectivities, i.e., in the range from about 2.3 to 1 to about 4.0 to 1.

To further illustrate the advantages of the present invention, Table 2 shows, in one embodiment, the etch rates and aluminum-to-photoresist selectivities of the inventive $Cl_2/N_2$ two-component etchant source gas as well as those of prior art gas compositions $HCl/Cl_2/N_2$ and $BCl_3/C_2/N_2$, as well as an $HBr/Cl_2/N_2$ gas composition. The etch rates and selectivities shown in Table 2 are obtained under identical processing conditions and with identical substrates. The details regarding the substrates and processing parameters employed are further discussed in the examples below.

TABLE 2

| Gas Compositions | $Cl_2/N_2$ | $HCl/Cl_2/N_2$ | $BCl_3/Cl_2/N_2$ | $HBr/Cl_2/N_2$ |
|---|---|---|---|---|
| Al etch rate (angstroms/min) | 10,900 | 10,900 | 6,000 | 6,795 |
| Aluminum to Photoresist Selectivity | 2.71 | 3.10 | 2.28 | 4.04 |

The $Cl_2/N_2$ two-component etchant source gas of the present invention may contain an inert component such as argon or helium in amounts up to 50 percent by volume. As the term is used herein, "percent by volume" refers to the percent by volume of the gas composition that is fed to the reaction chamber, which is typically expressed in units of standard cm³/minute (sccm).

Furthermore, the $Cl_2/N_2$ two-component etchant source gas of the present invention may contain up to 10 percent by volume of a polymerizing component such as $CHF_3$ or $CF_4$, whose function is to facilitate passivation of the aluminum sidewall, thereby minimizing the undercutting of the aluminum sidewall and ensuring a more anisotropic etch effect, i.e., a more vertical aluminum sidewall after etching. Also, the $Cl_2/N_2$ two-component etchant source gas of the present invention may also contain up to 5% by volume of any other gas, including any chlorine, bromine, or fluorine-containing gas.

The specific processing parameters and conditions suitable for employing the inventive chlorine/nitrogen etchant source gas depend on the specific type and geometry of reactor. For example, the pressure at which the chlorine/nitrogen etchant source gas may range from about 0.01 mTorr to about 100 mTorr, more preferably at about 5 mTorr to about 25 mTorr and even more preferably at about 10 mTorr in a high plasma density reactor such as the TCP™ 9600 SE. The power to the top electrode in a TCP™-type reactor may range from about 150 to about 600 watts, and more preferably at about 400 watts for a 6-inch wafer.

The backside of the wafer may be cooled with helium having a pressure range of about zero to about 20 Torr. The bottom electrode and the walls of the reactor chamber may be heated to assist in the removal of the reaction by-products, e.g., $AlCl_3$ and $Al_2Cl_6$. Typical ranges of temperatures for the wafer-holding electrode and chamber walls are about 20 degrees to 100 degrees Celsius.

Figure 5:
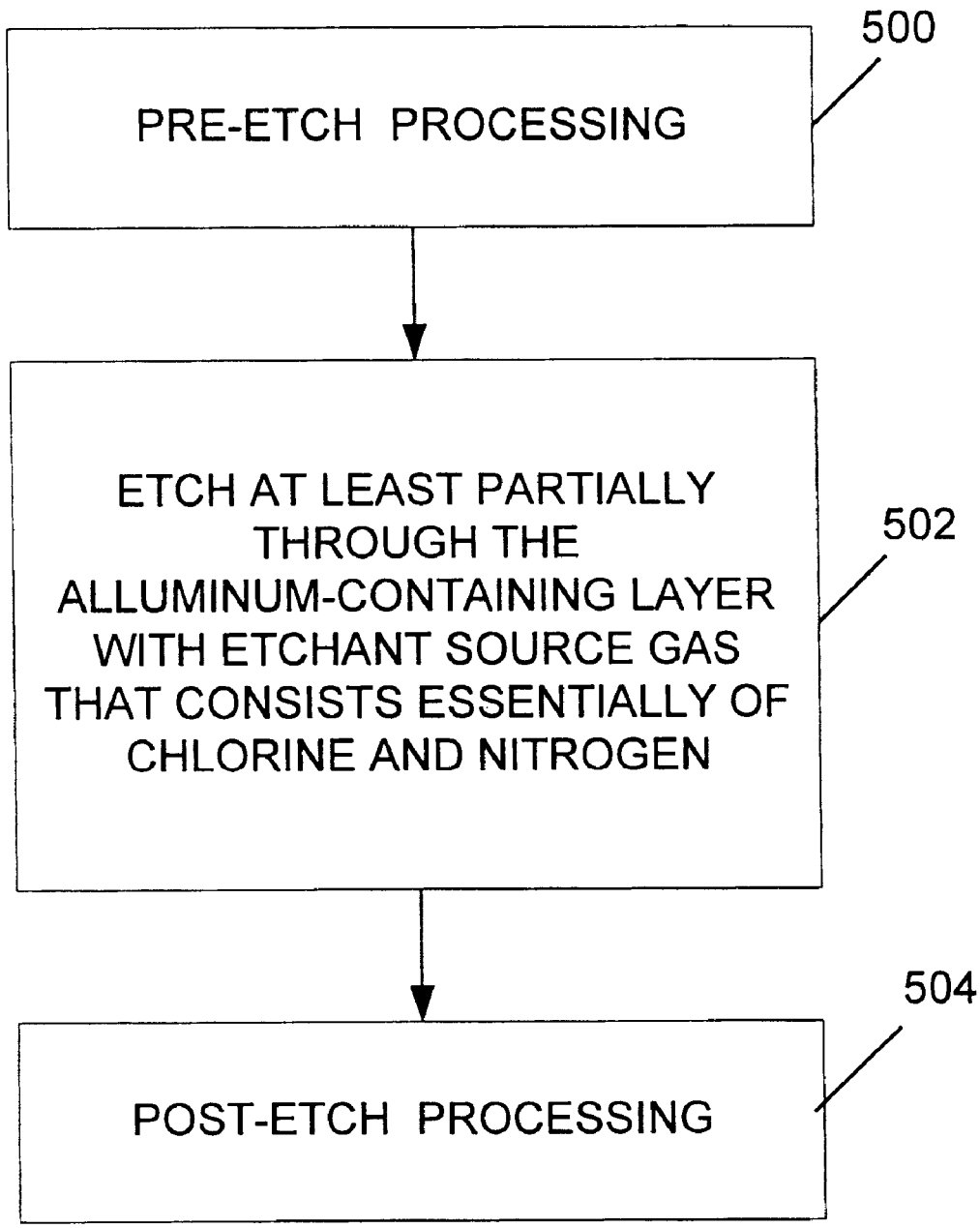
FIG. 5 shows, in accordance with one aspect of the present invention, the steps involved in the inventive etch process.

FIG. 5 shows, in accordance with one aspect of the present invention, the steps involved in the inventive etch process. In step 500, a wafer is prepared for etching in a conventional pre-etch step. The pre-etch step may include, for example, clamping the wafer onto chuck, stabilizing the pressure within the plasma processing chamber, and introducing helium cooling gas to the wafer backside to facilitate heat transfer between the wafer and the chuck.

In step 502, the metallization layer, e.g., the aluminum-containing layer, is etched using the inventive $Cl_2/N_2$ two-component etchant source gas. Preferably, the metallization layer is etched through completely by the inventive etchant source gas. Further, it is contemplated, in one embodiment, that both the anti-reflective layer and the aluminum-containing metallization layer may be etched through using the inventive $Cl_2/N_2$ two-component etchant source gas. The inventive $Cl_2/N_2$ two-component etchant source gas may also be employed to etch through a barrier containing, for example, Ti or TiN. It is also possible to employ the inventive etchant source gas to perform the bulk etch of the metal layer and other etchant source gases to finish off the metallization etch. It is possible as well to use other source etchant gases to etch through the ARC layer or the barrier layer.

In step 504, the wafer may undergo additional processing steps to fabricate the desired components as well as post-etch processing steps that are conventional in nature. Thereafter, the finished wafer may be cut into dies, which may then be made into IC chips. The resulting IC chip, e.g., IC chips 352 of FIG. 3, may then be incorporated in an electronic device, e.g., any of the of well known commercial or consumer electronic devices, including digital computers.

EXAMPLES

The aforementioned experimental results were derived from etching experiments performed on the following wafers according to the approximate process parameters outlined below. It should be borne in mind that the examples given below are merely illustrative of one application of the inventive etch technique and should in no way be construed to limit the usefulness of the invention when applied with other wafers, layer stack structures, etching systems, and/or process parameters.

Eight-inch p-type prime silicon wafers (200 mm in diameter) with a 100 orientation were obtained from Transition Technology International (Sunnyvale, Calif.). The wafers were patterned by Sematech (Austin, Tex.) with their Qcleave B-reticle. The layers of materials and their thicknesses going from the plasma to the surface of the wafer were as follows: approximately 11,200 Å photoresist (although this thickness decreased somewhat with decreasing line spacing), 250 Å of a TiN anti-reflective coating, 6,000 Å aluminum (with 0.5% by weight Cu added for the prevention of electromigration), a 500 Å titanium barrier layer, and finally 8,000 Å oxide ($SiO_2$) immediately adjacent to the wafer's surface.

Sematech's Qcleave B-reticle has, among other features, a pattern containing sets of aluminum lines with line spacings that range from about 2.0 to about 0.2 microns. Each group of lines is separated by an open field region.

The wafers in these experiments were processed in the aforementioned TCP™ 9600 SE etching system. The gap between the top and bottom electrodes was fixed at about 6 cm for these experiments. The tool was further equipped with an electrostatic chuck (ESC) for clamping a wafer to the bottom electrode.

The four etchant gas compositions $Cl_2/N_2$, $HCl/Cl_2/N_2$, $BCl_3/Cl_2/N_2$, and $HBr/Cl_2/N_2$ were compared with regard to their ability to etch aluminum. One wafer was etched with each of the four gas compositions. Each wafer came from the same patterning lot. The chamber pressure, helium backside pressure (for cooling the wafer), and bottom electrode temperature were held constant for each of the experiments at about 10 mTorr, 10 Torr, and 50° C., respectively.

Two steps in the recipe called for RF power to be applied to the electrodes. The purpose of the first step was to etch through the TiN anti-reflective coating. This step had approximately a 10 second duration, and a top and bottom electrode power of about 450 and 325 watts, respectively.

The second step removed the bulk of the aluminum. The top and bottom electrode powers for the main etch were about 450 and 150 watts, respectively. Since the ARC layer was only about 250 Å, thick, no attempt was made to optimize gas composition for this 10-second step, and the gas composition was set as it would be for the main etch. It is contemplated, however, that this initial etching step may be optimized, e.g., by varying the components of the gas composition, employing another gas composition, and/or varying the process parameters.

The total gas flow was kept constant at about 110 sccm for each of the four experiments. Although the total gas flow was held constant, the chlorine to nitrogen flow ratios were changed since the gas compositions were deliberately varied.

Although the duration of the etch varied among the four gas compositions, the amount of aluminum removed in the open field regions in each case was constant. The approximate process conditions for the experiments may be summarized as follows:

TABLE 3

| Etch parameter | $Cl_2/N_2$ | $HCl/Cl_2/N_2$ | $BCl_3/Cl_2/N_2$ | $HBr/Cl_2/N_2$ |
| --- | --- | --- | --- | --- |
| Reaction chamber pressure | 10 mTorr | 10 mTorr | 10 mTorr | 10 mTorr |
| Gas flows (total = 110 sccm) | | | | |
| $Cl_2$ | 75 sccm | 51 sccm | 42 sccm | 51 sccm |
| $N_2$ | 35 sccm | 8 sccm | 16 sccm | 8 sccm |
| HCl | — | 51 sccm | — | — |
| $BCl_3$ | — | — | 52 sccm | — |
| HBr | — | — | — | 51 sccm |
| RF power (watts) | | | | |
| top electrode | 450 | 450 | 450 | 450 |
| bottom electrode | 150 | 150 | 150 | 150 |
| He backside pressure | 10 Torr | 10 Torr | 10 Torr | 10 Torr |
| Bottom electrode temperature | 50° C. | 50° C. | 50° C. | 50° C. |
| Time of etch (seconds) | 33 | 33 | 57 | 50 |

The photoresist was not removed after the etch so that aluminum to photoresist etch rate selectivity measurements could be taken from SEM micrographs. The wafers were, however, treated in the atmospheric passivation module (APM) of the TCP™ 9600 to minimize corrosion. The APM treatment consisted of rinsing for one minute with 60° C. deionized water, and then drying for one minute at room temperature with a flow of nitrogen gas.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In an inductively coupled plasma processing chamber, a method for etching through a selected portion of a metallization layer of a wafer's layer stack, said method comprising:

placing said wafer on a chuck within said chamber;

using a first radio frequency generator to bias said chuck;

using a second radio frequency generator to energize an electrode located above said chamber, wherein a gap of about 6 cm is formed between the chuck and the electrode;

etching at least partially through said metallization layer of said layer stack with an etchant source gas that consists essentially of chlorine and nitrogen, wherein the flow ratio of said chlorine to said nitrogen ranges from about 1:1 to about 2:1; and using the nitrogen to passivate aluminum sidewalls and other surfaces during the etching.

2. The method of claim 1 wherein said etching step is performed without employing $BCl_3$.

3. The method of claim 1 wherein said metallization layer comprises aluminum.

4. In an inductively coupled plasma processing chamber, a method for minimizing etch rate loading while etching through an aluminum-containing layer of a wafer's layer stack, said method comprising:

placing said wafer on a chuck in said chamber;

using a first radio frequency generator to bias said chuck;

using a second radio frequency generator to energize an electrode located above said chamber, wherein a gap of about 6 cm is formed between the chuck and the electrode; and etching at least partially through said aluminum-containing layer of said layer stack with an etchant source gas that consists essentially of chlorine and nitrogen.

5. The method of claim 4 wherein a flow ratio of said chlorine to said nitrogen ranges from about 1:1 to about 10:1.

6. The method of claim 5 wherein said etchant source gas is employed to etch through an anti-reflective layer of said layer stack prior to etching said aluminum-containing layer.

7. The method of claim 4 wherein a flow ratio of said chlorine to said nitrogen ranges from about 1:1 to about 4:1.

8. The method of claim 4 wherein a flow ratio of said chlorine to said nitrogen ranges from about 1:1 to about 2:1.

9. In an inductively coupled plasma processing chamber, a method for fabricating components from a layer stack disposed on a semiconductor wafer, comprising:

etching at least partially through an aluminum-containing layer of said layer stack with an etchant source gas that consists essentially of chlorine and nitrogen; wherein the flow ratio of said chlorine to said nitrogen ranges from about 1:1 to about 4:1; and using the nitrogen to passivate aluminum sidewalls and other surfaces during the etching.

10. The method of claim 9 wherein the flow ratio of said chlorine to said nitrogen ranges from about 1:1 to about 2:1.

* * * * *